United States Patent [19]
Lin et al.

[11] Patent Number: 5,780,348
[45] Date of Patent: Jul. 14, 1998

[54] METHOD OF MAKING A SELF-ALIGNED SILICIDE COMPONENT

[75] Inventors: Tony Lin, Kao Hsiung Hsien; Water Lur; Shih-Wei Sun, both of Taipei, all of Taiwan

[73] Assignee: United Microelectronics Corporation, Taipei, Taiwan

[21] Appl. No.: 892,314

[22] Filed: Jul. 14, 1997

[51] Int. Cl.$^6$ .................. H01L 21/283; H01L 21/336
[52] U.S. Cl. .................. 438/303; 438/586; 438/634; 438/649; 438/683
[58] Field of Search .................. 438/233, 299, 438/301, 303, 305, 586, 592, 649, 651, 655, 682, 683, 634, 637, 664

[56] References Cited

U.S. PATENT DOCUMENTS

| | | | |
|---|---|---|---|
| 4,735,680 | 4/1988 | Yen | 438/649 |
| 4,912,061 | 3/1990 | Nasr | 438/233 |
| 4,944,682 | 7/1990 | Cronin et al. | 438/586 |
| 5,183,771 | 2/1993 | Mitsui et al. | 438/586 |
| 5,661,052 | 8/1997 | Inoue et al. | 438/303 |
| 5,698,468 | 12/1997 | Kapoor | 438/586 |

*Primary Examiner*—T. N. Quach
*Attorney, Agent, or Firm*—Rabin & Champagne, P.C.

[57] ABSTRACT

A method of making a self-aligned silicide component having parasitic spacers formed on the sides of an upper surface of the component isolating regions, the bottom sides of the spacers and the exposed sides of the gate regions, which increases a distance from a metal silicide layer at a corner of an active region neighboring the component isolating region to the source/drain junction, to prevent undesired current leakages. The formation of parasitic spacers increases a distance from the metal silicide layer lying above the gate surface to the metal silicide layer lying above the source/drain surface so that an ability to withstand electrostatic damages is enhanced.

15 Claims, 5 Drawing Sheets

METHOD OF MAKING A SELF-ALIGNED SILICIDE COMPONENT

BACKGROUND OF THE INVENTION

1. Field of Invention

This invention relates to a method of making a self-aligned suicide (salicide) component. More particularly, the present invention relates to a method of making a salicide component that uses double spacers to prevent undesired current leakages from a source/drain junction.

2. Description of Related Art

As a MOS component's level of integration is increased, resistance in the source/drain terminals of the MOS component will gradually increase to a level comparable to the channel resistance of the MOS component. To ensure integrity between the metal and the shallow junction of the MOS component, and to lower the sheet resistance in the source/drain terminals, self-aligned silicide is currently used in the manufacturing of semiconductor components whenever a line width is less than about 0.5 μm.

FIGS. 1A through 1E show the manufacturing progression of a self-aligned silicide component according to a conventional method. Referring to FIG. 1A, a substrate 10 is provided. At least one MOS component region 11 is provided over substrate 10. MOS component region 11 includes a gate region 12, lightly doped drain (LDD) regions 12a, and isolating regions 13. The isolating regions 13 can be a shallow trench isolation (STI) region formed using a field oxide layer, for example, as shown in the illustration.

An insulating layer 14, for example, a silicon dioxide layer or a silicon nitride layer, is formed over the substrate 10. Then, an overetching process is performed, in which the insulating layer 14 is overetched to form spacers 15 on the two sidewalls of the gate region 12. The spacers 15 have a height slightly below an upper level of the gate region 12. During the overetching process, an upper layer of the isolating regions 13 will also be removed. Thereafter, using the spacers 15 and gate region 12 as masks, the substrate 10 is doped to form source/drain regions 16, thus forming the structure shown in FIG. 1B.

Subsequently, and referring to FIG. 1C, a metallic layer 17, for example, a titanium layer, is formed over the aforementioned structure. Next, rapid thermal processing (RTP) is performed, during which the metallic layer 17 reacts with a polysilicon at the top surfaces of the gate region 12 and the source/drain regions 16. This reaction forms a metal silicide layer 18 which extends to the isolating regions 13 adjacent to the source/drain regions 16. Thereafter, wet etching is used to remove any unreacted portion of metallic layer 17, thus forming a cross-sectional structure as shown in FIG. 1D.

Referring to FIG. 1E, a dielectric layer 19, for example, a silicon dioxide layer or a silicon nitride layer, is formed over the aforementioned structure. Then, the dielectric layer 19 is patterned to form a contact window 20. Contact window 20 exposes the metal silicide layer 18 located on top of the source/drain region 16. Additionally, contact window 20 exposes a portion of the isolating region 13. This completes the manufacturing of the self-aligned silicide layer using the conventional method.

In order to reduce the line width of the metal silicide layers, while maintaining an effective line width over the source/drain regions and gate region, the aforementioned conventional method requires overetching of the spacers. However, the overetching process also etches away part of an upper silicon dioxide layer of the isolating regions 13. Moreover, locating the metal silicide layer 18 at the corner of the isolating region 13, and so near to the junction of the source/drain regions 16, will generate undesired current leakages. As a result, component malfunctions will occur. This problem is especially serious with submicron components having a shallow junction.

SUMMARY OF THE INVENTION

It is an object of this invention to provide a method of making a self-aligned silicide component that uses double spacers to prevent the generation of undesired current leakages from occurring from the self-aligned silicide through the junction of the source/drain region.

A further object of this invention is to provide a method of making a self-aligned silicide component that uses double spacers to increase a distance between the gate region and the source/drain regions so as to improve the ability of the component to withstand electrostatic damage.

To attain these objects and advantages, and in accordance with the purpose of the invention, as embodied and broadly described herein, the invention comprises a method of manufacturing a self-aligned silicide component, which includes providing a type one substrate having at least a MOS component region above. The MOS component region includes a gate region, lightly doped source/drain regions and component isolating regions. A first insulating layer is deposited above the substrate surface. Using an anisotropic overetching process, the first insulating layer is removed to form spacers on the sidewalls of the gate region. At the same time, part of the upper layer of the component isolating region is also removed. Using the spacers and gate region as masks, type two ions are implanted into the component region to form a plurality of source/drain regions in the substrate on each side of the gate region. A second insulating layer is formed over the surfaces of the aforementioned layers. The second insulating layer is removed using an anisotropic overetching process to form a plurality of parasitic spacers on the sides of the removed component isolating regions, the bottom sides of the spacers and the exposed sides of the gate regions. A metallic layer is formed over the surfaces of the aforementioned layers. Using a rapid thermal processing, the metallic layer is caused to react with the silicon on the top surfaces of the gate region and the source/drain regions. Subsequently, using a selective etching method, the unreacted metallic layer is removed. A third insulating layer and a dielectric layer are sequentially formed above the surfaces. A pattern is defined on the dielectric layer using the third insulating layer as an etching stop, to form a plurality of wide border contact windows. The third insulating layer is removed through the wide border contact windows so as to expose the metal silicide and to form the self-aligned silicide component according to the invention.

BRIEF DESCRIPTION OF THE DRAWINGS

Other objects, features, and advantages of the invention will become apparent from the following detailed description of the preferred but non-limiting embodiment. The description is made with reference to the accompanying drawings in which.

DESCRIPTION OF THE PREFERRED EMBODIMENT

FIGS. 2A through 2G show the manufacturing progression of a self-aligned silicide component according to one preferred embodiment of this invention. In this embodiment, a P-type silicon substrate is used for illustrative purposes. However, the invention is equally applicable when an N-type silicon substrate is used.

Figure 1A:
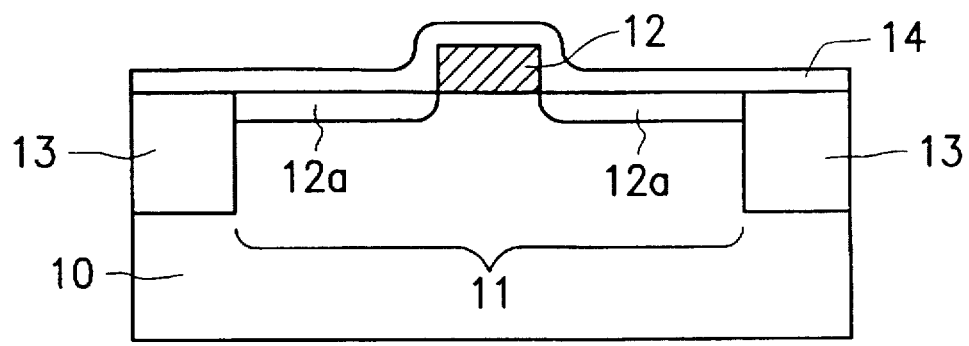
FIGS. 1A through 1E show the manufacturing progression of a self-aligned silicide component according to a conventional method.
Figure 1B:
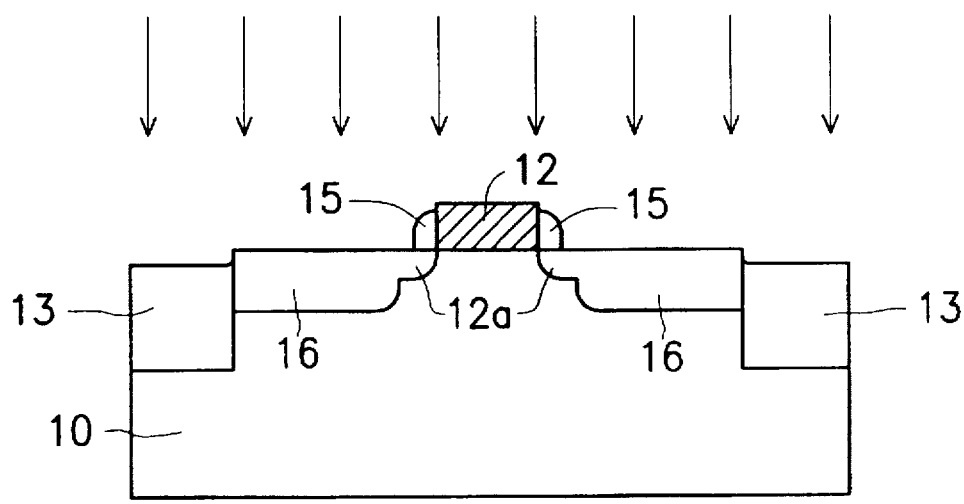
Figure 1C:
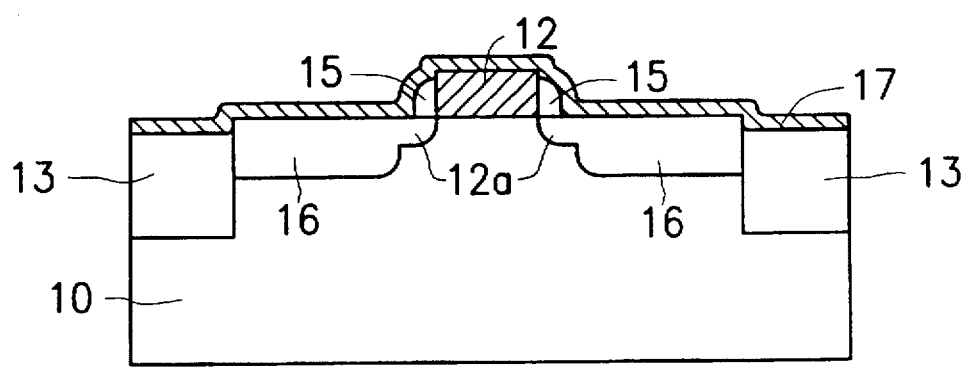
Figure 1D:
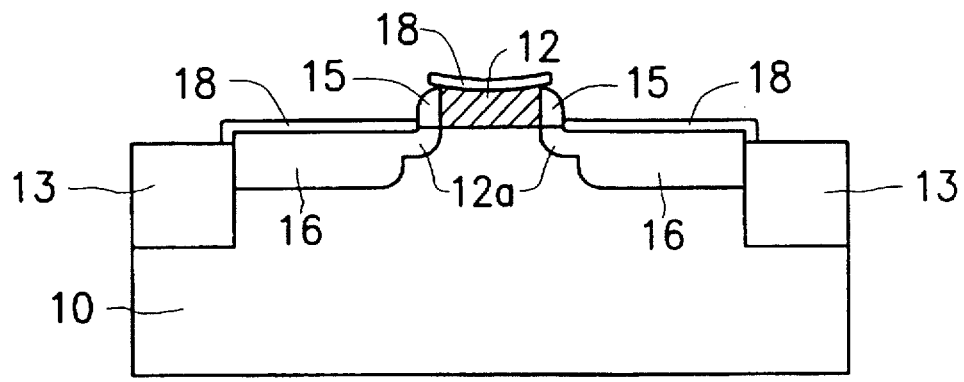
Figure 1E:
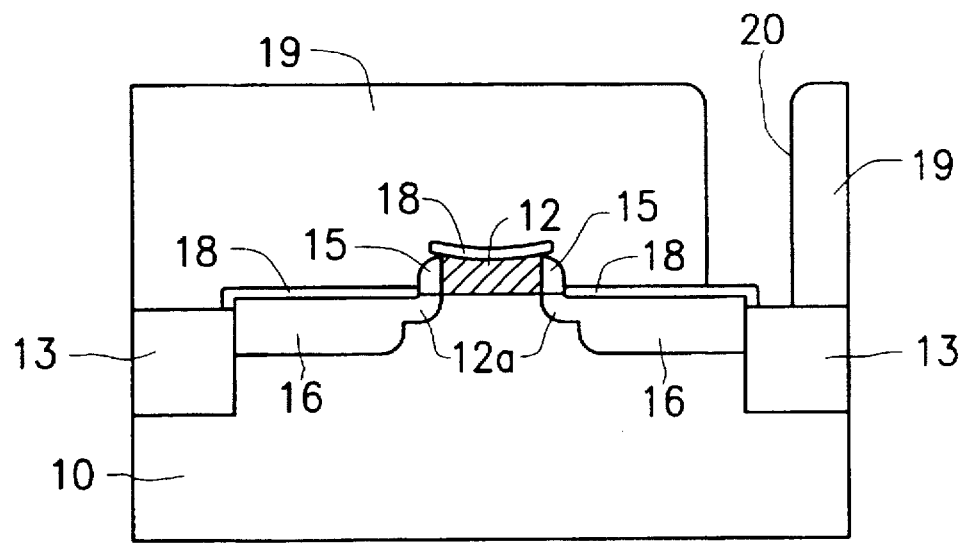
Figure 2A:
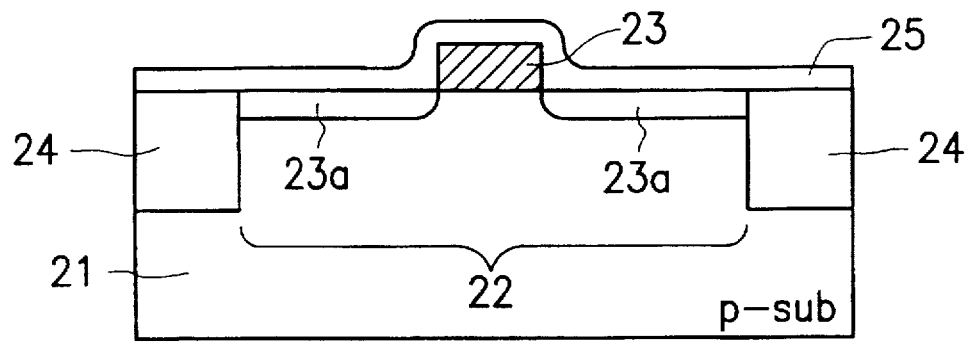
FIGS. 2A through 2G show the manufacturing progression of a self-aligned silicide component according to the present invention.

Referring to FIG. 2A, a substrate 21, for example, a P-type silicon substrate having at least a MOS component region 22 thereabove, is provided. The MOS component region 22 includes a gate region 23, lightly doped regions 23a and component isolating regions 24. The component isolating regions 24 can be, for example, a silicon dioxide shallow trench isolation region, or a field oxide layer. In this embodiment, a shallow trench isolation region is used for illustration purposes.

Figure 2B:
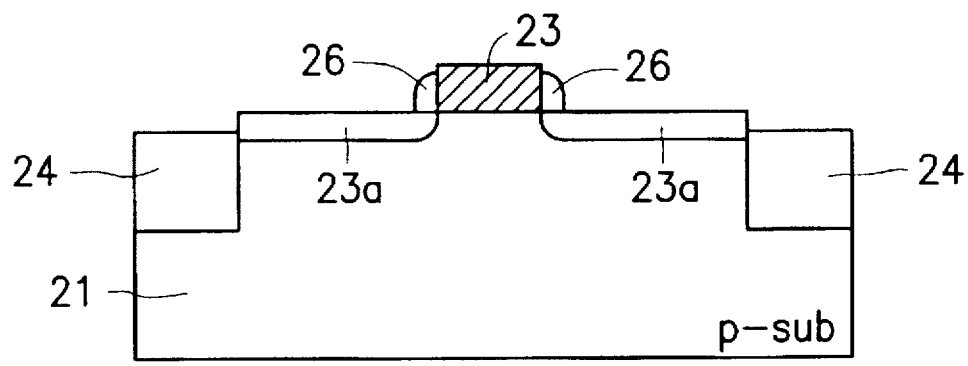

Next, an insulating layer 25 is formed over the substrate 21 using, for example, chemical vapor deposition. The insulating layer 25 can be, for example, a silicon oxide layer or a silicon nitride layer. Then, anisotropic overetching is performed to remove most of the insulating layer 25, thereby forming spacers 26 on sidewalls of the gate region 23. The spacers 26 have a height which is slightly lower than a height of the gate region 23. During the overetching procedure, an upper layer of the component isolating regions 24 will also be removed. This increases a contact area of the MOS component region 22, and results in the structure as shown in FIG. 2B.

Figure 2C:
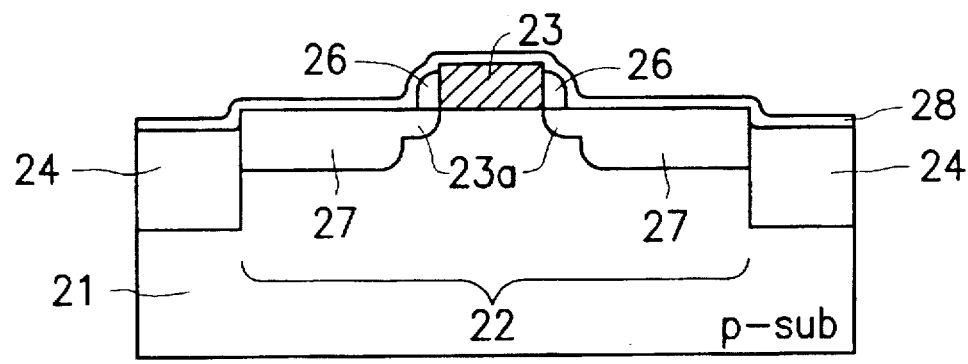

Thereafter, and referring to FIG. 2C, the spacers 26 and gate region 23 are used as masks. Ions, for example, N-type ions, are implanted into the substrate 21 to form source/drain regions 27 within substrate 21 and on two sides of the gate region 23. Subsequently, an insulating layer 28, for example, a silicon oxide layer or a silicon nitride layer, is formed over the aforementioned structure.

Figure 2D:
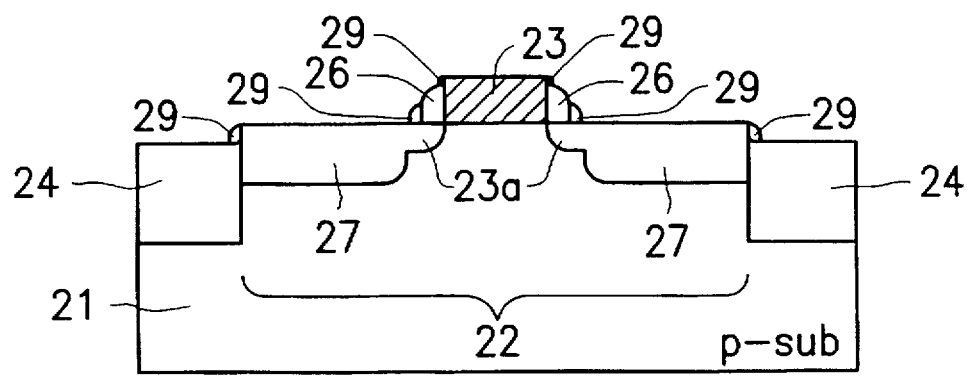

Next, as shown in FIG. 2D, anisotropic overetching is used to remove most of the insulating layer 28 and form parasitic spacers 29. Parasitic spacers 29 are located on the sides of the source/drain regions 27 in a region of the removed portion of the component isolating regions 24, at the bottom of the sides of the spacers 26, and at the exposed portion of the sides of gate regions 23, resulting in the structure shown in FIG. 2D.

The parasitic spacers 29 can also be formed before forming the source/drain regions 27 by the following alternative sequence. First, insulating layer 28 is formed. Then, anisotropic overetching is used to remove most of the insulating layer 28 and form parasitic spacers 29 on the sides of substrate 21 in a region of the removed portion of the component isolating regions 24, at the bottom of the sides of the spacers 26, and the exposed portion of the sides of the gate regions 23. Subsequently, using gate regions 23, spacers 26 and parasitic spacers 29 as masks, N-type ions are implanted into the substrate 21 to form the source/drain regions 27 in the substrate 21 on two sides of the gate region 23.

Figure 2E:
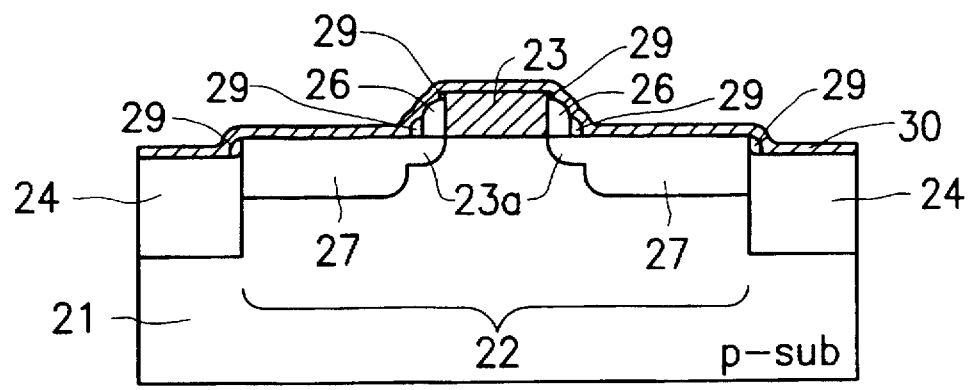
Figure 2F:
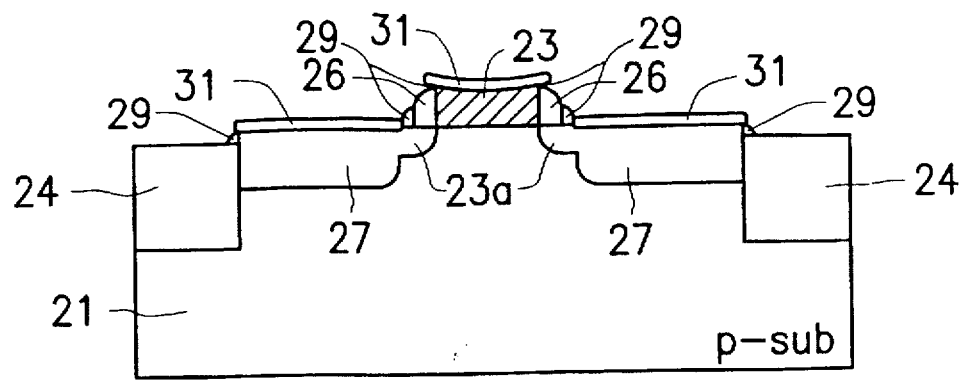

Referring to FIG. 2E, a metallic layer 30, for example, a titanium layer, is formed above the aforementioned structure. Subsequently, rapid thermal annealing is performed, causing metallic layer 30 to react with silicon on a top surface of the gate to region 23 and the source/drain regions 27, thus forming a self-aligned metal silicide layer 31. Thereafter, wet etching is used to remove any unreacted portion of metallic layer 30, resulting in a structure as shown in FIG. 2F.

Figure 2G:
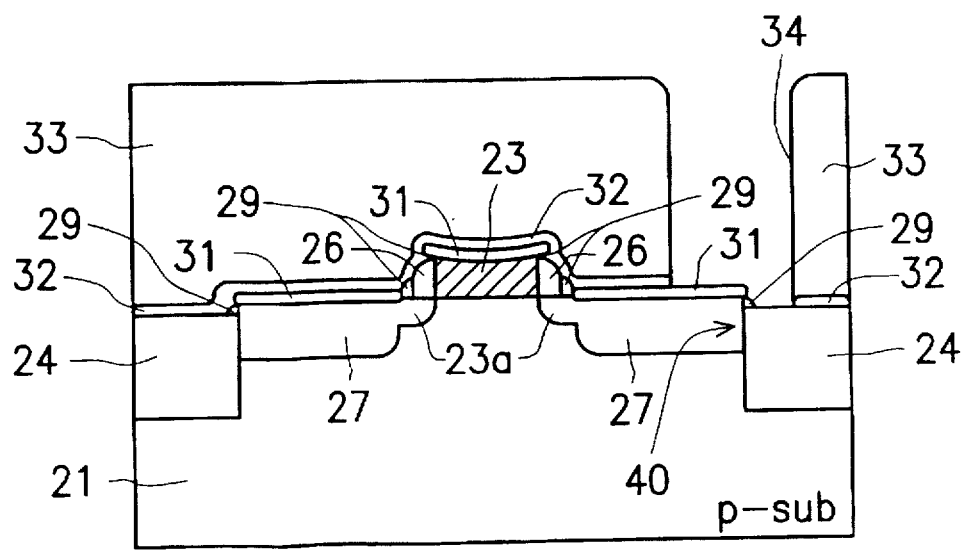

Referring to FIG. 2G, an insulating layer 32 and a dielectric layer 33 are sequentially formed above the surfaces of the structure. The insulating layer 32 can be, for example, a silicon nitride layer, and the dielectric layer 33 can be, for example, a silicon oxide layer. Next, the dielectric layer 33 is patterned using the insulating layer 32 as an etching stop layer. Thereafter, the exposed portions of the insulating layer 32 are removed to form a wide border contact window 34, thereby exposing the metal silicide layer 31. Subsequent processing operations are conventional, and so detailed descriptions are omitted herein.

The method of forming a self-aligned silicide component according to the present invention has at least the following advantages: (1) The formation of parasitic spacers 29 increases a distance from the metal silicide layer 31 at the corners of the source/drain region 27 adjacent to the component isolating region 24, to the source/drain junction, as indicated by the arrow 40 in FIG. 2G. This prevents undesired current leakages from occurring. (2) The formation of parasitic spacers 29 increases a distance from the metal silicide layer 31 lying above the surface of gate region 23, to the metal silicide layer 31 lying above the surface of source/drain region 27. Therefore, the self-aligned silicide component has an increased ability to withstand electrostatic damages.

While the invention has been described by way of example and in terms of the preferred embodiment, it is to be understood that the invention is not limited to the disclosed embodiment. To the contrary, it is intended to cover various modifications and similar arrangements as would be apparent to those skilled in the art. Therefore, the scope of the appended claims, which define the invention, should be accorded the broadest interpretation so as to encompass all such modifications and similar structures.

What is claimed is:

1. A method of manufacturing a self-aligned silicide component, comprising:

providing a substrate of a first conductivity type having at least a MOS component region thereabove, with the MOS component region including a gate region, lightly doped regions and component isolating regions;

depositing a first insulating layer above a surface of the substrate;

anisotropic overetching the first insulating layer to remove the first insulating layer and form spacers on respective sidewalls of the gate region, and to remove a portion of an upper layer of the component isolating regions;

implanting ions of a second conductivity type into the MOS component region, using the spacers and gate region as masks, to form a plurality of source/drain regions in the substrate on each side of the gate region;

forming a second insulating layer over a surface of the substrate, the MOS component region and the spacers;

anisotropic overetching the second insulating layer to form a plurality of parasitic spacers located at a side of an upper surface of the component isolating regions, at a bottom portion of a side of the spacers, and at an exposed portion of a side of the gate region, respectively;

forming a metallic layer over a surface of the substrate, the MOS component region, the spacers and the parasitic spacers;

performing rapid thermal processing to cause the metallic layer to react with a silicon on a top surface of the gate region and the source/drain regions and form a metal silicide layer;

subsequent to said performing, selectively etching to remove any unreacted portion of the metallic layer;

sequentially forming a third insulating layer and a dielectric layer above a surface of the substrate, the MOS component region, the spacers, the parasitic spacers, and the metal silicide layer;

patterning the dielectric layer, using the third insulating layer as an etching stop, to form a plurality of wide border contact windows; and removing the third insulating layer through the wide border contact windows so as to expose the metal silicide layer.

2. The method according to claim 1, wherein said providing includes providing a P-type substrate, and said implanting includes implanting N-type ions.

3. The method according to claim 1, wherein said providing includes providing an N-type substrate, and said implanting includes implanting P-type ions.

4. The method according to claim 1, wherein said providing includes comprising the component isolating regions of a shallow trench isolation region.

5. The method according to claim 1, wherein said providing includes comprising the component isolating regions of a field oxide layer.

6. The method according to claim 1, wherein said depositing a first insulating layer includes comprising the first insulating layer of silicon oxide.

7. The method according to claim 1, wherein said depositing a first insulating layer includes comprising the first insulating layer of silicon nitride.

8. The method according to claim 1, wherein said implanting is performed after said anisotropic overetching the second insulating layer and before said forming a metallic layer.

9. The method according to claim 1, wherein said implanting is performed after said anisotropic overetching the first insulating layer and before said forming a second insulating layer.

10. The method according to claim 1, wherein said forming a second insulating layer includes comprising the second insulating layer of silicon oxide.

11. The method according to claim 1, wherein said forming a second insulating layer includes comprising the second insulating layer of silicon nitride.

12. The method according to claim 1, wherein said forming a metallic layer includes comprising the metallic layer of titanium.

13. The method according to claim 1, wherein said sequentially forming includes comprising the third insulating layer of silicon nitride.

14. The method according to claim 1, wherein said sequentially forming includes comprising the dielectric layer of silicon oxide.

15. A method of manufacturing a self-aligned silicide component, comprising:

providing a gate region on a substrate, spacers on respective sidewalls of the gate region, a plurality of source/drain regions in the substrate on each side of the gate region, and component isolating regions located adjacent to respective source/drain regions;

forming a first insulating layer over the substrate;

anisotropic overetching the first insulating layer to form a plurality of parasitic spacers located at a side of an upper surface of the component isolating regions, at a bottom portion of a side of the spacers, and at an exposed portion of a side of the gate region, respectively;

forming a metallic layer over the substrate;

performing rapid thermal processing to cause the metallic layer to react with a silicon on a top surface of the gate region and the source/drain regions and form a metal silicide layer;

subsequent to said performing, selectively etching to remove any unreacted portion of the metallic layer;

sequentially forming a second insulating layer and a dielectric layer above the substrate;

patterning the dielectric layer, using the second insulating layer as an etching stop, to form a plurality of wide border contact windows; and removing the second insulating layer through the wide border contact windows so as to expose the metal silicide layer.

* * * * *